(12) United States Patent
Zou et al.

(10) Patent No.: US 11,917,894 B2
(45) Date of Patent: Feb. 27, 2024

(54) METHOD FOR PREPARING ORGANIC ELECTROLUMINESCENT DEVICE, AND ORGANIC ELECTROLUMINESCENT DEVICE AND DISPLAY APPARATUS

(71) Applicant: GUANGZHOU NEW VISION OPTO-ELECTRONIC TECHNOLOGY CO., LTD., Guangdong (CN)

(72) Inventors: Jianhua Zou, Guangdong (CN); Miao Xu, Guangdong (CN); Hong Tao, Guangdong (CN); Lei Wang, Guangdong (CN); Hongmeng Li, Guangdong (CN); Wencong Liu, Guangdong (CN); Hua Xu, Guangdong (CN); Min Li, Guangdong (CN); Junbiao Peng, Guangdong (CN)

(73) Assignee: GUANGZHOU NEW VISION OPTO-ELECTRONIC TECHNOLOGY CO., LTD., Guangdong (CN)

( * ) Notice: Subject to any disclaimer, the term of this patent is extended or adjusted under 35 U.S.C. 154(b) by 444 days.

(21) Appl. No.: 17/312,878

(22) PCT Filed: Mar. 4, 2019

(86) PCT No.: PCT/CN2019/076798
§ 371 (c)(1),
(2) Date: Jun. 10, 2021

(87) PCT Pub. No.: WO2020/118916
PCT Pub. Date: Jun. 18, 2020

(65) Prior Publication Data
US 2022/0059808 A1    Feb. 24, 2022

(30) Foreign Application Priority Data
Dec. 12, 2018 (CN) .......................... 201811519363.0

(51) Int. Cl.
*H10K 71/00* (2023.01)
*H10K 50/818* (2023.01)
(Continued)

(52) U.S. Cl.
CPC .......... *H10K 71/00* (2023.02); *H10K 50/818* (2023.02); *H10K 50/828* (2023.02); *H10K 59/35* (2023.02);
(Continued)

(58) Field of Classification Search
CPC .... H10K 71/00; H10K 50/818; H10K 50/828; H10K 59/35; H10K 59/1201;
(Continued)

(56) References Cited

U.S. PATENT DOCUMENTS

2017/0243928 A1* 8/2017 Yang .................... H10K 50/818
2019/0198816 A1* 6/2019 Park ..................... H10K 59/123
(Continued)

FOREIGN PATENT DOCUMENTS

CN        1367938 A       9/2002
CN      105720081 A       6/2016
(Continued)

OTHER PUBLICATIONS

International Search Report from corresponding PCT Application No. PCT/CN2019/076798 dated Sep. 18, 2019.
(Continued)

*Primary Examiner* — Yasser A Abdelaziez
(74) *Attorney, Agent, or Firm* — Burns & Levinson, LLP; Joseph M. Maraia

(57) ABSTRACT

Provided are a method for preparing an organic electroluminescent device, an organic electroluminescent device and a display apparatus. The method for preparing the organic electroluminescent device includes: providing a substrate; forming, on the substrate, a red light reflective electrode
(Continued)

located in a red sub-pixel preparation region, a green light reflective electrode located in a green sub-pixel preparation region, and a blue light reflective electrode located in a blue sub-pixel preparation region; forming a transparent insulating layer on a surface of a side of the red light reflective electrode facing away from the substrate, where the area of the transparent insulating layer is smaller than the area of the red light reflective electrode; and forming a transparent conductive layer on a surface of a side of the transparent insulating layer facing away from the substrate, a surface of the side of the red light reflective electrode facing away from the substrate and not covered by the transparent insulating layer, and a surface of a side of the green light reflective electrode facing away from the substrate.

12 Claims, 5 Drawing Sheets

(51) Int. Cl.
*H10K 50/828* (2023.01)
*H10K 59/35* (2023.01)
H10K 59/12 (2023.01)
H10K 102/10 (2023.01)
H10K 102/00 (2023.01)

(52) U.S. Cl.
CPC ... *H10K 59/1201* (2023.02); *H10K 2102/102* (2023.02); *H10K 2102/103* (2023.02); *H10K 2102/351* (2023.02)

(58) Field of Classification Search
CPC ....... H10K 2102/102; H10K 2102/103; H10K 2102/351; H10K 50/852; H10K 59/30; H10K 59/38; H10K 2102/3026; H10K 50/82; H10K 59/122; H10K 50/115
See application file for complete search history.

(56) References Cited

U.S. PATENT DOCUMENTS

2019/0312220 A1* 10/2019 Tsukamoto ............... G09F 9/30
2020/0161585 A1* 5/2020 Palles-Dimmock .........................
H10K 85/1135

FOREIGN PATENT DOCUMENTS

| CN | 106981504 A | 7/2017 |
| CN | 107154424 A | 9/2017 |
| CN | 107170786 A | 9/2017 |
| CN | 107515498 A | 12/2017 |
| CN | 108365115 A | 8/2018 |
| IN | 107195584 A | 9/2017 |
| JP | 2015090810 A | 5/2015 |

OTHER PUBLICATIONS

First Search of CN Application No. 2018115193630 filed on Dec. 12, 2018.
First Office Action from CN Application No. 2018115193630 dated Mar. 2, 2020.

* cited by examiner

METHOD FOR PREPARING ORGANIC ELECTROLUMINESCENT DEVICE, AND ORGANIC ELECTROLUMINESCENT DEVICE AND DISPLAY APPARATUS

CROSS REFERENCE TO RELATED APPLICATIONS

This is a National Stage Application filed under 35 U.S.C. 371 based on International Patent Application No. PCT/CN2019/076798, filed on Mar. 4, 2019, which claims priority to Chinese Patent Application No. 201811519363.0 filed on Dec. 12, 2018, the disclosures of both of which are incorporated herein by reference in their entireties.

TECHNICAL FIELD

The present disclosure relates to the technical field of electronics, for example, a method for preparing an organic electroluminescent device, an organic electroluminescent device and a display apparatus.

BACKGROUND

There are two main technologies for implementing the colorization of an organic light-emitting diode (OLED): a micro-cavity effect red green blue (RGB) pixel independent light-emitting technology, and a technology of combining a white light-emitting material with a color filter.

In micro-cavity effect RGB pixel independent light-emitting technology, a technology of aligning precise metal shadow masks with pixels is required to prepare light-emitting centers of red, green and blue primary colors for micro-cavity effect, so as to implement the colorization. Thus, it is necessary to use a precise metal shadow mask. However, it is difficult to ensure the positioning accuracy of a sub-pixel by using the method of the metal shadow mask, and also relatively difficult to implement a display panel with a high pixel density. Moreover, the precise metal shadow mask is expensive, thereby increasing costs.

In the technology of combining the white light-emitting material with the color filter, an OLED device emitting white light is firstly prepared, then three primary colors are obtained through color filters, and finally, the three primary colors are combined to implement color display. The preparation process does not require the technology of aligning precise metal shadow masks, and it is feasible to use a mature technology for preparing a color filter of a liquid crystal displayer. In this way, it is easy to implement a large-scale panel and a high pixel density. Therefore, the technology of combining the white light-emitting material with the color filter is a potential full-colorization technology among future technologies for preparing an OLED displayer.

OLED devices may be divided into two structures according to different directions in which light emits from the devices: one structure is a bottom emitting device, and the other structure is a top emitting device. Light from the top emitting device is emitted from the top of the device, which is not affected by a bottom driving panel of the device, thus effectively improving the aperture ratio and helping to integrate the device and a bottom driving circuit. Therefore, an OLED device with a high pixel density usually requires the device structure of top light-emitting.

In a traditional top-emitting OLED display panel of white light, multiple sub-pixels correspond to consistent optical cavity lengths, so that light emitted by an organic light-emitting layer of white light generates micro-cavity effect under the same cavity length, which makes it difficult to enhance RGB, and even RGB light cannot be emitted at the same time, thus affecting the final colorization of a display apparatus.

In the related art, transparent conductive layers with different thicknesses may be prepared on a red sub-pixel, a green sub-pixel and a blue sub-pixel by using a yellow light region process on reflective electrodes to implement the adjustment to RGB optical cavity lengths. However, the transparent conductive layers have similar material properties and the etching selection ratio is difficult to ensure in multi-layer etching, resulting in overetching, and thus, a transparent conductive layer that should not be etched is partially etched; or a next-layer film easily crystallize in the preparation of an upper-layer film, and thus, the film cannot be etched.

SUMMARY

The present disclosure provides a method for preparing an organic electroluminescent device, an organic electroluminescent device and a display apparatus to help the etching selection for an optical adjustment layer and improving the etching accuracy for the optical adjustment layer.

The present disclosure provides a method for preparing an organic electroluminescent device. The organic electroluminescent device includes multiple pixels. Each pixel includes at least a red sub-pixel, a green sub-pixel and a blue sub-pixel. The method for preparing the organic electroluminescent device includes the steps described below.

A substrate is provided. The substrate includes a red sub-pixel preparation region corresponding to the red sub-pixel, a green sub-pixel preparation region corresponding to the green sub-pixel, and a blue sub-pixel preparation region corresponding to the blue sub-pixel.

A red light reflective electrode located in the red sub-pixel preparation region, a green light reflective electrode located in the green sub-pixel preparation region, and a blue light reflective electrode located in the blue sub-pixel preparation region are formed on the substrate.

A transparent insulating layer is formed on a surface of a side of the red light reflective electrode facing away from the substrate. The area of the transparent insulating layer is smaller than the area of the red light reflective electrode.

A transparent conductive layer is formed on a surface of a side of the transparent insulating layer facing away from the substrate, a surface of the side of the red light reflective electrode facing away from the substrate and not covered by the transparent insulating layer, and a surface of a side of the green light reflective electrode facing away from the substrate.

A pixel definition layer is formed between adjacent sub-pixels.

An organic light-emitting structure is formed on a surface of a side of the transparent conductive layer facing away from the substrate and a surface of a side of the blue light reflective electrode facing away from the substrate. The organic light-emitting structure includes at least an organic light-emitting layer.

A cathode is formed on a surface of a side of the organic light-emitting structure facing away from the substrate.

An encapsulation layer is formed on one side of the cathode facing away from the substrate.

The present disclosure provides an organic electroluminescent device. The organic electroluminescent device includes multiple pixels. Each pixel includes at least a red sub-pixel, a green sub-pixel and a blue sub-pixel. The multiple pixels include a substrate, a reflective electrode layer, a transparent insulating layer, a transparent conductive layer, a pixel definition layer, an organic light-emitting structure, a cathode and an encapsulation layer.

The substrate includes a red sub-pixel preparation region corresponding to the red sub-pixel, a green sub-pixel preparation region corresponding to the green sub-pixel, and a blue sub-pixel preparation region corresponding to the blue sub-pixel.

The reflective electrode layer is formed on the substrate and includes a red light reflective electrode located in the red sub-pixel preparation region, a green light reflective electrode located in the green sub-pixel preparation region, and a blue light reflective electrode located in the blue sub-pixel preparation region.

The transparent insulating layer is located on a surface of a side of the red light reflective electrode facing away from the substrate. The area of the transparent insulating layer is smaller than the area of the red light reflective electrode.

The transparent conductive layer is located on a surface of a side of the transparent insulating layer facing away from the substrate, a surface of the side of the red light reflective electrode facing away from the substrate and not covered by the transparent insulating layer, and a surface of a side of the green light reflective electrode facing away from the substrate.

The pixel definition layer is formed between adjacent sub-pixels.

The organic light-emitting structure is located on a surface of a side of the transparent conductive layer facing away from the substrate, and a surface of a side of the blue light reflective electrode facing away from the substrate. The organic light-emitting structure includes at least an organic light-emitting layer.

The cathode is located on a surface of a side of the organic light-emitting structure facing away from the substrate.

The encapsulation layer is located on one side of the cathode away from the substrate.

The present disclosure provides a display apparatus. The display apparatus incudes the preceding organic electroluminescent device.

According to the present disclosure, a transparent insulating layer and a transparent conductive layer are sequentially formed on a red light reflective electrode, and the transparent conductive layer is electrically connected to the red light reflective electrode not covered by the transparent insulating layer, so that the transparent insulating layer and the transparent conductive layer form a part of an optical adjustment layer of a red sub-pixel, and thereby, the optical cavity length of the red sub-pixel may be adjusted by adjusting thicknesses of the transparent insulating layer and the transparent conductive layer. Moreover, since the transparent insulating layer and the transparent conductive layer are greatly different in the material property (etching), the transparent insulating layer and the transparent conductive layer are quite different in the etching rate of the same etching mode, that is, the etching selection ratio is relatively large, thus helping to select etching modes for the transparent insulating layer and the transparent conductive layer, preventing the transparent conductive layer that does not need to be etched from being partially etched off, and improving the etching accuracy for the optical adjustment layer.

DETAILED DESCRIPTION

Figure 1:
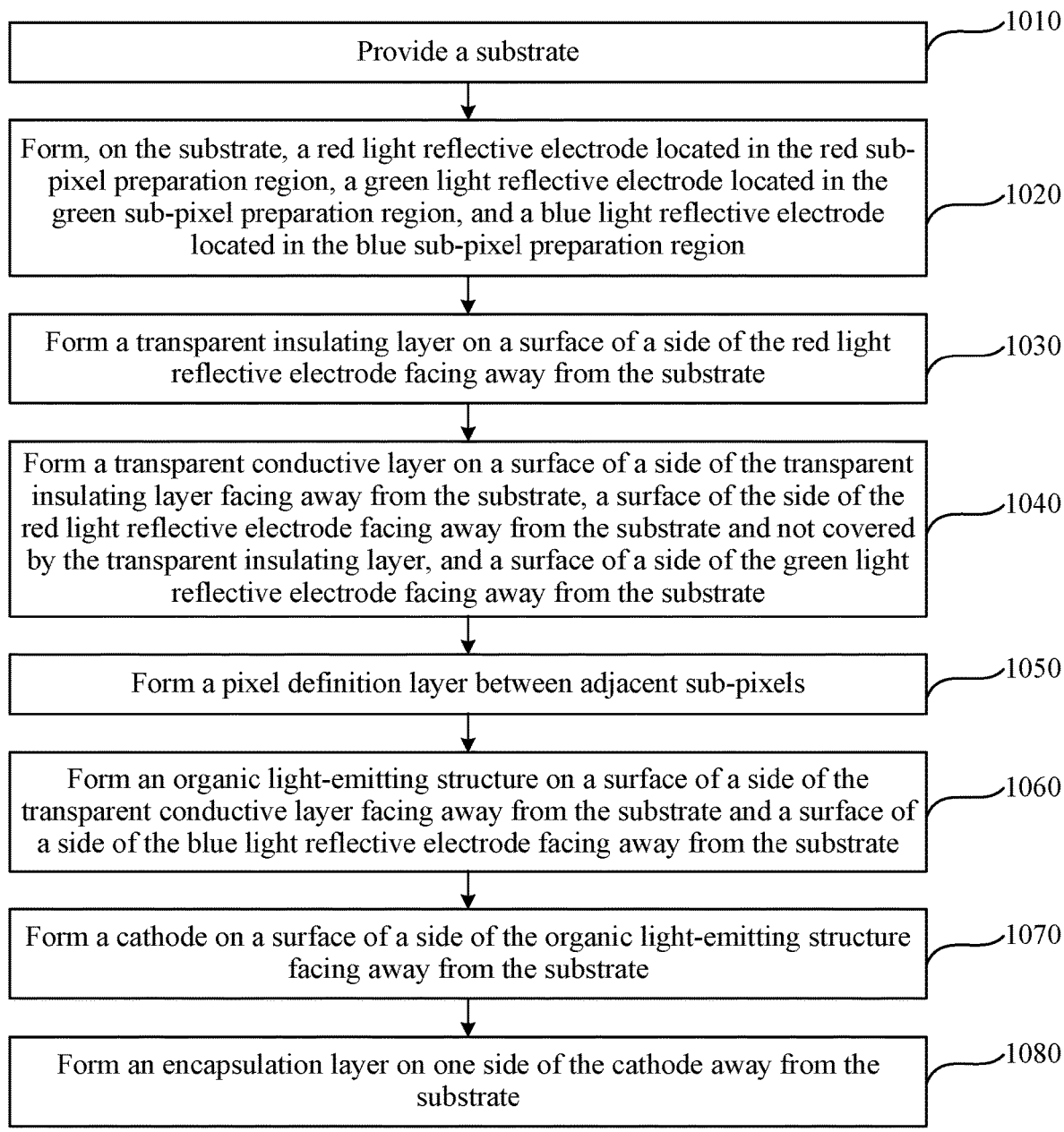
FIG. 1 is a flowchart of a method for preparing an organic electroluminescent device according to an embodiment.

The solutions of the present disclosure are described hereinafter through specific implementations in conjunction with the drawings. The embodiments described herein are merely intended to explain the present disclosure and not to limit the present disclosure. Additionally, for ease of description, only part, not all, of structures related to the present disclosure are illustrated in the drawings.

FIG. 1 is a flowchart of a method for preparing an organic electroluminescent device according to an embodiment. FIGS. 2 to 10 are schematic diagrams of main structures corresponding to multiple preparation processes in a method for preparing an organic electroluminescent device according to an embodiment. A display panel of this embodiment includes multiple pixels. Each pixel includes at least a red sub-pixel, a green sub-pixel and a blue sub-pixel. As shown in FIG. 1, the method for preparing the display panel includes the steps described below.

In step 1010, a substrate is provided.

In this embodiment, the substrate may be a rigid substrate or a flexible substrate. The material of the rigid substrate may be glass. The material of the flexible substrate may be polyimide. The thickness of the substrate may be set according to process demands and product requirements.

In this embodiment, the substrate includes a red sub-pixel preparation region corresponding to the red sub-pixel, a green sub-pixel preparation region corresponding to the green sub-pixel, and a blue sub-pixel preparation region corresponding to the blue sub-pixel, so as to prepare the red sub-pixel, the green sub-pixel and the blue sub-pixel in the red sub-pixel preparation region, the green sub-pixel preparation region and the blue sub-pixel preparation region, respectively.

In an embodiment, the red sub-pixel preparation region, the green sub-pixel preparation region and the blue sub-pixel preparation region are predetermined regions on the substrate.

In step 1020, a red light reflective electrode located in the red sub-pixel preparation region, a green light reflective electrode located in the green sub-pixel preparation region, and a blue light reflective electrode located in the blue sub-pixel preparation region are formed on the substrate.

Figure 2:
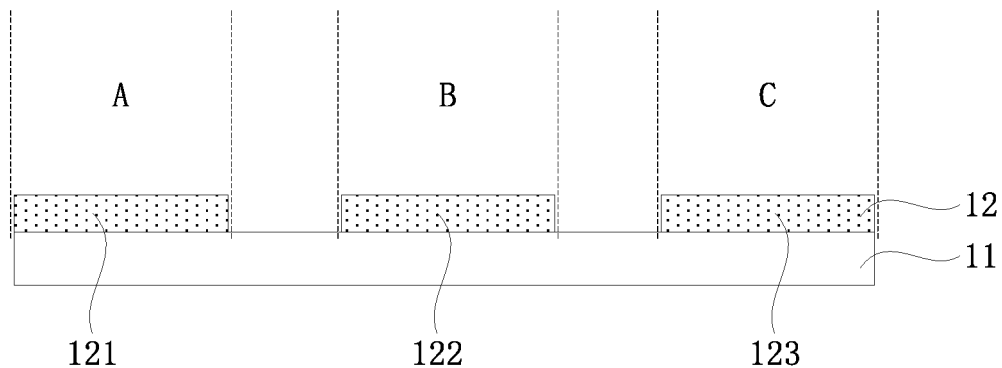
FIG. 2 is a schematic diagram of main structures of a red light reflective electrode, a green light reflective electrode and a blue light reflective electrode formed in a method for preparing an organic electroluminescent device according to an embodiment.

In an embodiment, referring to FIG. 2, a reflective electrode layer 12 is deposited on the substrate 11, and photoresist is coated on the reflective electrode layer 12. After exposure and development, photoresist in the red sub-pixel preparation region A, the green sub-pixel preparation region B and the blue sub-pixel preparation region C is retained, and the exposed reflective electrode layer 12 is etched to form the red light reflective electrode 121 located in the red sub-pixel preparation region A, the green light reflective electrode 122 located in the green sub-pixel preparation region B, and the blue light reflective electrode 123 located in the blue sub-pixel preparation region C. Moreover, the red light reflective electrode 121, the green light reflective electrode 122 and the blue light reflective electrode 123 are insulated from each other. In an embodiment, the red light reflective electrode 121, the green light reflective electrode 122 and the blue light reflective electrode 123 are block-shaped and arranged in an array (corresponding to the arrangement of sub-pixel preparation regions).

In step 1030, a transparent insulating layer is formed on a surface of a side of the red light reflective electrode facing away from the substrate.

In this embodiment, the area of the transparent insulating layer is smaller than the area of the red light reflective electrode.

Figure 3:
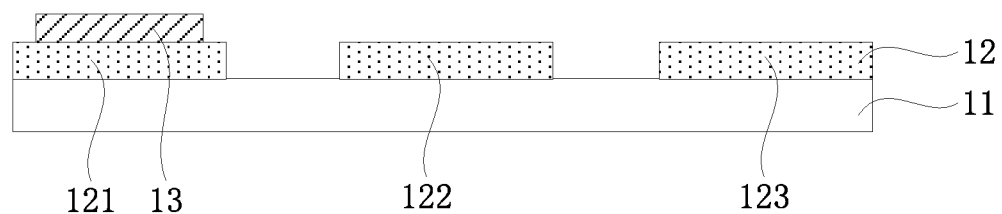
FIG. 3 is a schematic diagram of a main structure of a transparent insulating layer formed in a method for preparing an organic electroluminescent device according to an embodiment.
Figure 4:
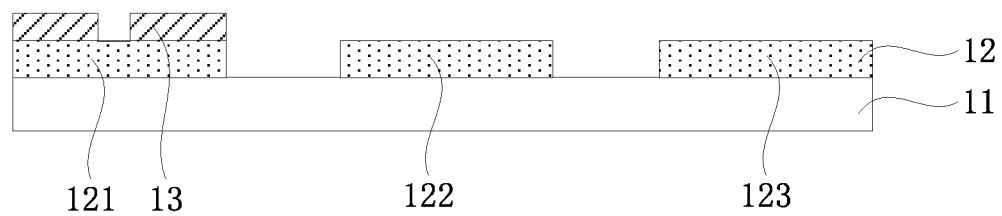
FIG. 4 is a schematic diagram of a main structure of a transparent insulating layer formed in another method for preparing an organic electroluminescent device according to an embodiment.

In an embodiment, referring to FIG. 3, a transparent insulating film may be formed on one side of the reflective electrode layer 12 facing away from the substrate 11, and photoresist may be coated on the transparent insulating film. After exposure and development, part of photoresist in the red sub-pixel preparation region may be retained, and the exposed transparent insulating film may be etched off to form the transparent insulating layer 13 located in the red sub-pixel preparation region. In this case, the area of the transparent insulating layer 13 is smaller than the area of the red light reflective electrode 121, that is, the transparent insulating layer 13 does not completely cover the red light reflective electrode 121, so that in a subsequent process, a transparent conductive layer formed on the transparent insulating layer 13 is electrically connected to the red light reflective electrode 121. In this way, the transparent insulating layer 13 acts as the transparent conductive layer, and the optical cavity length can be adjusted. In this embodiment, the planar shape of the transparent insulating layer 13 and the region of the red light reflective electrode 121 not covered by the transparent insulating layer 13 are not limited. For example, the planar shape of the transparent insulating layer 13 may be rectangular, as shown in FIG. 3, and the transparent insulating layer 13 may be located in the middle of the red light reflective electrode 121, exposing a peripheral region of the red light reflective electrode 121. As shown in FIG. 4, the outer contour of the transparent insulating layer 13 may coincide with the outer contour of the red light reflective electrode 121, and at least one via is formed in the transparent insulating layer 13 to expose a part of the red light reflective electrode 121. In this embodiment, the material of the transparent insulating layer 13 may be silicon dioxide (SiO2), silicon nitride (SiNx) or photoresist. In an embodiment, the photoresist may be SU-8 photoresist. SU-8 photoresist is a type of epoxy type near ultraviolet negative photoresist.

In step 1040, the transparent conductive layer is formed on a surface of a side of the transparent insulating layer facing away from the substrate, a surface of the side of the red light reflective electrode facing away from the substrate and not covered by the transparent insulating layer, and a surface of a side of the green light reflective electrode facing away from the substrate.

Figure 5:
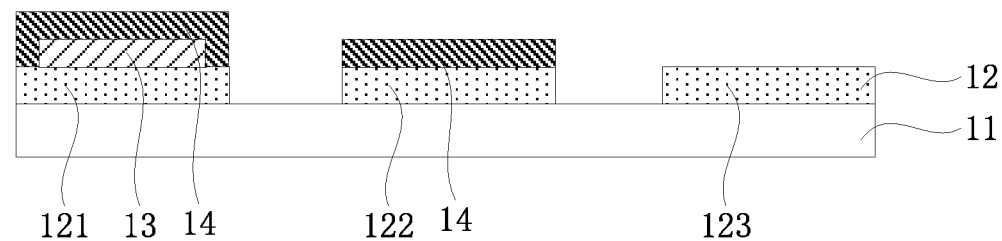
FIG. 5 is a schematic diagram of a main structure of a transparent conductive layer formed in a method for preparing an organic electroluminescent device according to an embodiment.

In an embodiment, referring to FIG. 5, a transparent conductive film is formed on the surface of the side of the transparent insulating layer 13 facing away from the substrate 11 and on a surface of the side of the reflective electrode layer 12 facing away from the substrate 11, and photoresist is coated on the transparent conductive film. After exposure and development, photoresist in the red sub-pixel preparation region and the green sub-pixel preparation region is retained, and the exposed transparent conductive film is etched off to form the transparent conductive layer 14 located in the red sub-pixel preparation region and the green sub-pixel preparation region. That is, the transparent conductive layer 14 is formed on the surface of the side of the transparent insulating layer 13 facing away from the substrate 11, the surface of the side of the red light reflective electrode 121 facing away from the substrate 11 and not covered by the transparent insulating layer 13, and the surface of the side of the green light reflective electrode 122 facing away from the substrate 11. In this embodiment, the material of the transparent conductive layer 14 may be indium tin oxide (ITO), aluminum zinc oxide (AZO) or indium zinc oxide (IZO).

In step 1050, a pixel definition layer is formed between adjacent sub-pixels.

In an embodiment, the pixel definition layer may be an organic material. The pixel definition layer may define an open region (a light-emitting region) of each sub-pixel.

Figure 6:
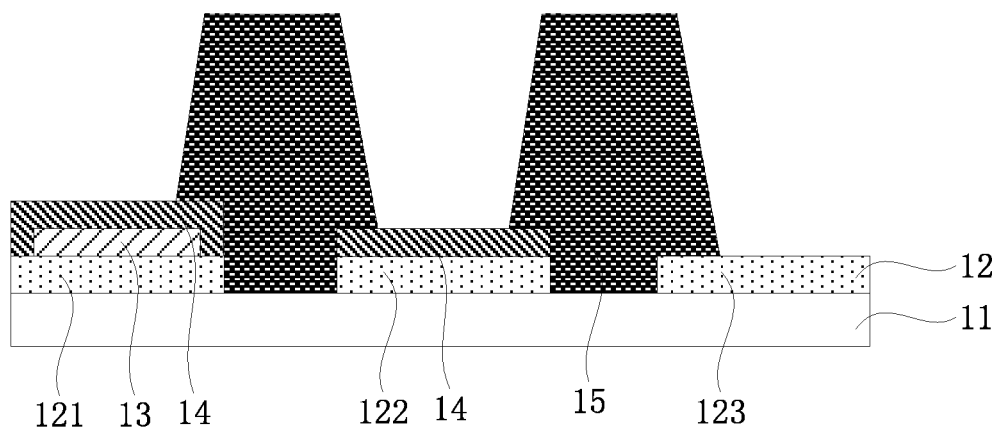
FIG. 6 is a schematic diagram of a main structure of a pixel definition layer formed in a method for preparing an organic electroluminescent device according to an embodiment.

In an embodiment, referring to FIG. 6, the pixel definition layer 15 is formed between any two adjacent sub-pixels to define a light-emitting region of an organic light-emitting structure.

In step 1060, the organic light-emitting structure is formed on a surface of a side of the transparent conductive layer facing away from the substrate and a surface of a side of the blue light reflective electrode facing away from the substrate.

In this embodiment, the organic light-emitting structure includes at least an organic light-emitting layer. In an embodiment, the organic light-emitting structure may further include a hole transport layer and a hole generation layer sequentially stacked on one side of the organic light-emitting layer close to the substrate, and an electron transport layer and an electron generation layer sequentially stacked on one side of the organic light-emitting layer facing away from the substrate.

In an embodiment, the organic light-emitting layer may be an organic light-emitting layer of white light, and combined with a color filter, the organic light-emitting layer displays a color image. The organic light-emitting layer may include a red light-emitting material, a green light-emitting material and a blue light-emitting material, which directly emit red light, green light and blue light, respectively. This is not particularly limited in this embodiment, and organic electroluminescent devices with different structures may be prepared according to customer requirements.

Figure 7:
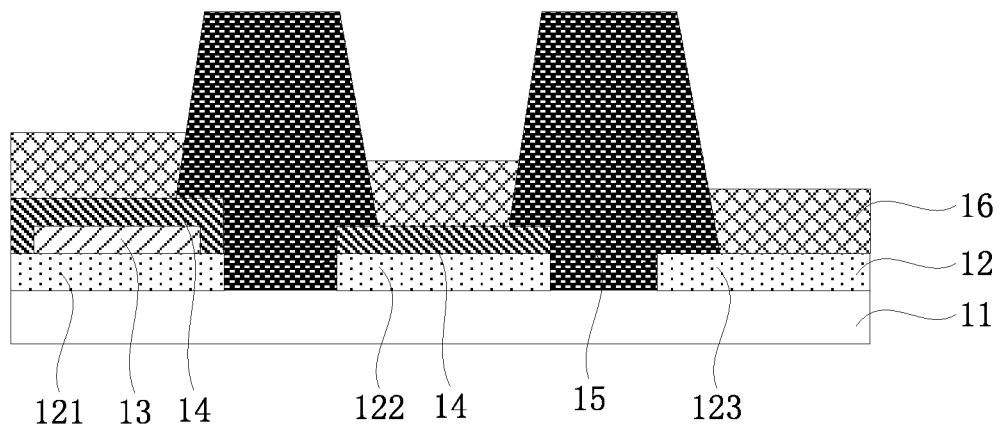
FIG. 7 is a schematic diagram of a main structure of an organic light-emitting structure formed in a method for preparing an organic electroluminescent device according to an embodiment.

In this embodiment, the organic light-emitting structure may be formed on the surface of the side of the transparent conductive layer 14 facing away from the substrate, and the surface of the side of the blue light reflective electrode 123 facing away from the substrate by a deposition or evaporation process. The organic light-emitting structure may be deposited or evaporated on the whole surface. That is, the organic light-emitting structure covers the pixel definition layer at the same time. However, to avoid the mutual interference of different colors of light between different sub-pixels, in an embodiment, as shown in FIG. 7, the organic light-emitting structure 16 is formed by evaporation in a region between pixel defining layers 15. That is, the organic light-emitting structure 16 is formed by evaporation on the surface of the side of the transparent conductive layer 14 facing away from the substrate 11 and the surface one the one side of the blue light reflective electrode 123 facing away from the substrate 11, where the surface of the side of the transparent conductive layer 14 facing away from the substrate 11 and the surface one the one side of the blue light reflective electrode 123 facing away from the substrate 11 are between the pixel defining layers 15.

In step 1070, a cathode is formed on a surface of a side of the organic light-emitting structure facing away from the substrate.

In this embodiment, the reflective electrode layer, the organic light-emitting structure and the cathode form an organic light-emitting diode.

Figure 8:
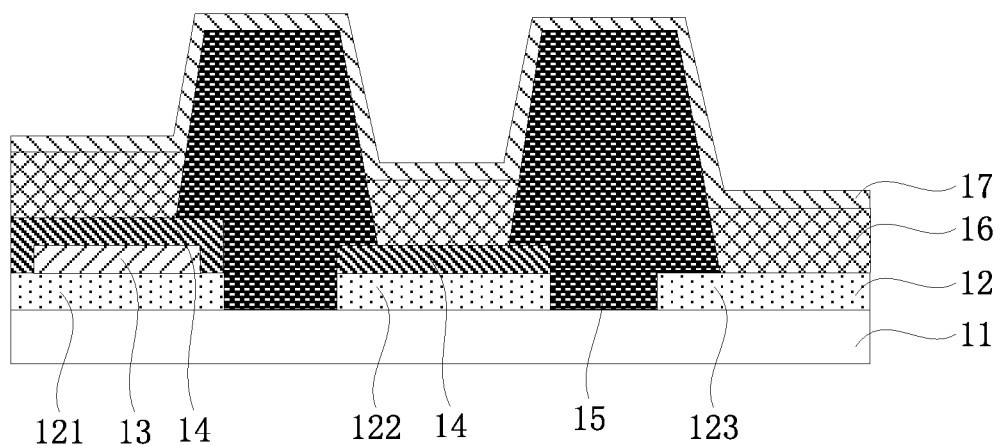
FIG. 8 is a schematic diagram of a main structure of a cathode formed in a method for preparing an organic electroluminescent device according to an embodiment.

In an embodiment, as shown in FIG. 8, based on the organic light-emitting structure 16 shown in FIG. 7, the cathode 17 may be formed as a whole on the surface of the side of the organic light-emitting structure 16 facing away from the substrate 11 and a surface of a side of the pixel definition layer 15 facing away from the substrate 11, or cathode 17s corresponding to sub-pixels may be formed on only the surface of the side of the organic light-emitting structure 16 facing away from the substrate 11, which is not limited in this embodiment. In this embodiment, the cathode 17 may be a transparent electrode or a translucent electrode.

In step 1080, an encapsulation layer is formed on one side of the cathode away from the substrate.

Figure 9:
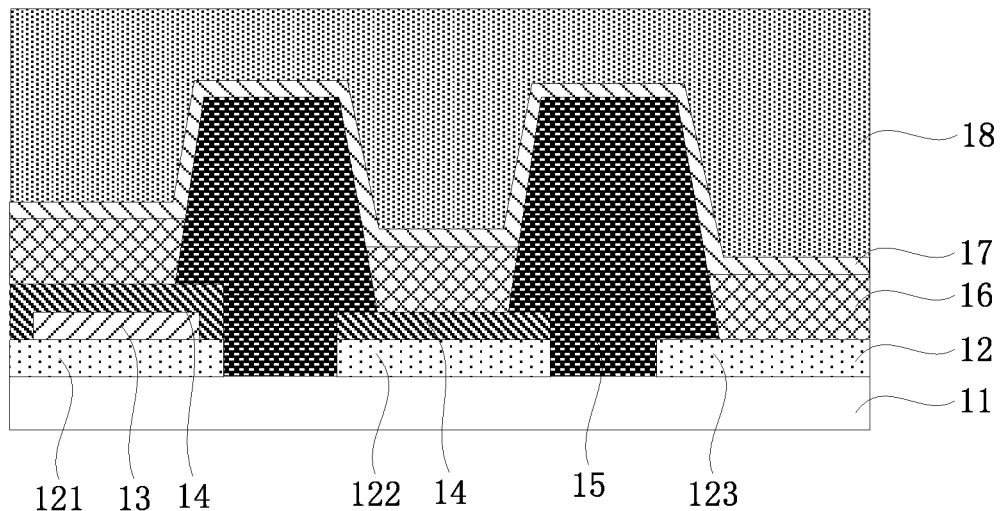
FIG. 9 is a schematic diagram of a main structure of an encapsulation layer formed in a method for preparing an organic electroluminescent device according to an embodiment.

In an embodiment, referring to FIG. 9, the encapsulation layer 18 is formed on the one side of the cathode away from the substrate 11. In an embodiment, the encapsulation layer 18 may be a glass cover plate or a film encapsulation layer.

According to this embodiment, a transparent insulating layer and a transparent conductive layer are sequentially formed on a red light reflective electrode, and the transparent conductive layer is electrically connected to the red light reflective electrode not covered by the transparent insulating layer, so that the transparent insulating layer and the transparent conductive layer form a part of an optical adjustment layer of a red sub-pixel, and thereby, the optical cavity length of the red sub-pixel may be adjusted by adjusting thicknesses of the transparent insulating layer and the transparent conductive layer. Moreover, since the transparent insulating layer and the transparent conductive layer are greatly different in the material property (etching), the transparent insulating layer and the transparent conductive layer are quite different in the etching rate of the same etching mode, that is, the etching selection ratio is relatively large, thus helping to select etching modes for the transparent insulating layer and the transparent conductive layer, preventing the transparent conductive layer that does not need to be etched from being partially etched off, and improving the etching accuracy for the optical adjustment layer.

In an embodiment, in the case where the organic light-emitting layer is an organic light-emitting layer of white light, after the step of forming the encapsulation layer, the method further includes: a color filter layer disposed corresponding to the red sub-pixel preparation region, the green sub-pixel preparation region and the blue sub-pixel preparation region is formed on one side of the encapsulation layer facing away from the substrate.

Figure 10:
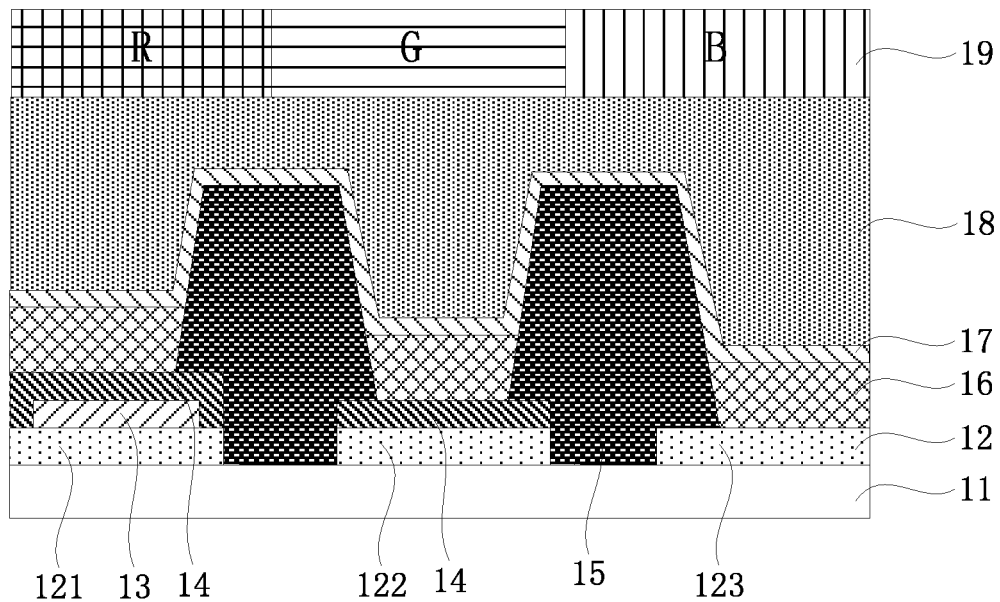
FIG. 10 is a schematic diagram of a main structure of a color filter layer formed in a method for preparing an organic electroluminescent device according to an embodiment.

In an embodiment, as shown in FIG. 10, the color filter layer 19 disposed corresponding to the red sub-pixel preparation region, the green sub-pixel preparation region and the blue sub-pixel preparation region is formed on the one side of the encapsulation layer facing away from the substrate.

Accordingly, the color filter layer 19 may include a red filter layer R disposed corresponding to the red sub-pixel preparation region, a green filter layer G disposed corresponding to the green sub-pixel preparation region, and a blue filter layer B disposed corresponding to the blue sub-pixel preparation region.

Based on the preceding solution, the disclosure further has the following technical effects: in this embodiment, merely by forming transparent electrode layers with different thicknesses by photolithography in the red sub-pixel preparation region and the green sub-pixel preparation region, different sub-pixels among the red sub-pixel, the green sub-pixel and the blue sub-pixel can correspond to different optical cavity lengths, thereby avoiding the microcavity effect under the same cavity length, and enhancing red light, green light and blue light. Moreover, it is not necessary to form a transparent electrode layer on the blue sub-pixel by photolithography, thereby reducing the photolithography process, simplifying the preparation process of a display panel, and reducing the process difficulty and cost.

In an embodiment, based on the preceding embodiment, the thickness $h_1$ of the transparent insulating layer satisfies the following formula:

$$h_1 = \frac{\frac{m\lambda_1}{2} - n_o * d - \frac{\lambda_1 * \theta_1}{4\pi} - n_2 * h_2}{n_1},$$

the thickness $h_2$ of the transparent conductive layer satisfies the following formula:

$$h_2 = \frac{\frac{m\lambda_2}{2} - n_o * d - \frac{\lambda_2 * \theta_2}{4\pi}}{n_2},$$

and the thickness d of the organic light-emitting structure satisfies the following formula:

$$d = \frac{\lambda_3 \left( \frac{m}{2} - \frac{\theta_3}{4\pi} \right)}{n_o}.$$

In the formulas, m denotes modulus, $\lambda_1$ denotes a center wavelength of red light, $\lambda_2$ denotes a center wavelength of green light, $\lambda_3$ denotes a center wavelength of blue light, $n_o$ denotes a refractive index of the organic light-emitting structure, $n_1$ denotes a refractive index of the transparent insulating layer, $n_2$ denotes a refractive index of the transparent conductive layer, $\theta_1$ denotes the sum of reflection phase shifts of red light on surfaces of the red light reflective electrode and the cathode, $\theta_2$ denotes the sum of reflection phase shifts of green light on surfaces of the green light reflective electrode and the cathode, $\theta_3$ denotes the sum of reflection phase shifts of blue light on surfaces of the blue light reflective electrode and the cathode. In this embodiment, the value of m may be 1 or 2.

Therefore, a micro-cavity structure of each sub-pixel may have the best cavity length, thereby enhancing light emitted by each sub-pixel.

Additionally, according to the preceding solution, light emitted by the sub-pixel can be enhanced independently, but after the spectrum of a certain wavelength is enhanced, there are other spectra weakened by optical cavity lengths nearby. Thus, the color filter layer is needed to filter out these impurity peaks in the colorization process, and about 50% light passing through the color filter layer is absorbed, thereby reducing the brightness and increasing the power consumption of a display screen. In the other aspect, if the color filter layer is processed on an OLED, it is necessary to require the color filter layer to be implemented in a process lower than 90 degrees Celsius (° C.), thus increasing the process difficulty. If the color filter layer is manufactured on an external substrate, a precise alignment is required to bond with a display substrate, thereby increasing the processes.

Therefore, based on the method for preparing the organic electroluminescent device described above, a color quantum dot material may be added into the organic light-emitting layer when the organic light-emitting layer is formed in this embodiment. In an embodiment, the organic light-emitting layer is a white quantum dot light-emitting layer. The white quantum dot light-emitting layer includes a red quantum dot material, a green quantum dot material and a blue quantum dot material. The white quantum dot light-emitting layer includes a red light-emitting peak, a green light-emitting peak and a blue light-emitting peak. The difference between the red light-emitting peak and the green light-emitting peak is larger than or equal to the sum of a red half-peak width and a green half-peak width. The difference between the green light-emitting peak and the blue light-emitting peak is larger than or equal to the sum of the green half-peak width and a blue half-peak width.

Since the quantum dot material has a narrow light-emitting spectrum and a high color purity when emitting light, after white light is synthesized by using a relatively pure color quantum dot material, the white light is reflected by of an electrode layer, and the cavity length is adjusted by the transparent electrode, so there are no corresponding impurity peaks, and thus, it is not necessary to filter out irrelevant impurity peaks by the color filter layer. Therefore, the color filter layer is not required in the structure of this embodiment. Meanwhile, the device brightness can be improved, the power consumption can be reduced, and the manufacturing cost can also be reduced.

This embodiment further provides an organic electroluminescent device. The organic electroluminescent device includes multiple pixels. Each pixel includes at least a red sub-pixel, a green sub-pixel and a blue sub-pixel. Referring to FIG. 9, the multiple pixels include a substrate 11, a reflective electrode layer 12, a transparent insulating layer 13, a transparent conductive layer 14, a pixel definition layer 15, an organic light-emitting structure 16 and a cathode 17. The substrate 11 includes a red sub-pixel preparation region corresponding to the red sub-pixel, a green sub-pixel preparation region corresponding to the green sub-pixel, and a blue sub-pixel preparation region corresponding to the blue sub-pixel. The reflective electrode layer 12 is formed on the substrate 11 and includes a red light reflective electrode 121 located in the red sub-pixel preparation region, a green light reflective electrode 122 located in the green sub-pixel preparation region, and a blue light reflective electrode 123 located in the blue sub-pixel preparation region. The transparent insulating layer 13 is located on a surface of a side of the red light reflective electrode 121 facing away from the substrate 11. The area of the transparent insulating layer 13 is smaller than the area of the red light reflective electrode 121. The transparent conductive layer 14 is located on a surface of a side of the transparent insulating layer 13 facing away from the substrate 11, a surface of the side of the red light reflective electrode 121 and not covered by the transparent insulating layer 13, and a surface of a side of the green light reflective electrode 122 facing away from the substrate 11. The pixel definition layer 15 is formed between adjacent sub-pixels. The organic light-emitting structure 16 is located on a surface of a side of the transparent conductive layer 14 facing away from the substrate 11 and a surface of a side of the blue light reflective electrode 123 facing away from the substrate 11. The organic light-emitting structure 16 includes at least an organic light-emitting layer. The cathode 17 is located on a surface of a side of the organic light-emitting structure 16 facing away from the substrate 11. The encapsulation layer 18 is located on one side of the cathode 17 facing away from the substrate 11.

This embodiment of the organic electroluminescent device and the preceding method embodiment belong to the same inventive concept and has the same functions and beneficial effects.

In an embodiment, the thickness $h_1$ of the transparent insulating layer satisfies the following formula:

$$h_1 = \frac{\frac{m\lambda_1}{2} - n_o * d - \frac{\lambda_1 * \theta_1}{4\pi} - n_2 * h_2}{n_1},$$

the thickness $h^2$ of the transparent conductive layer satisfies the following formula:

$$h_2 = \frac{\frac{m\lambda_2}{2} - n_o * d - \frac{\lambda_2 * \theta_2}{4\pi}}{n_2},$$

the thickness d of the organic light-emitting structure satisfies the following formula:

$$d = \frac{\lambda_3 \left( \frac{m}{2} - \frac{\theta_3}{4\pi} \right)}{n_o}.$$

In the formulas, m denotes modulus, $\lambda_1$ denotes a center wavelength of red light, $\lambda_2$ denotes a center wavelength of green light, $\lambda_3$ denotes a center wavelength of blue light, $n_o$ denotes a refractive index of the organic light-emitting structure, $n_1$ denotes a refractive index of the transparent insulating layer, $n_2$ denotes a refractive index of the transparent conductive layer, $\theta_1$ denotes the sum of reflection phase shifts of red light on surfaces of the red light reflective electrode and the cathode, $\theta_2$ denotes the sum of reflection phase shifts of green light on surfaces of the green light reflective electrode and the cathode, $\theta_3$ denotes the sum of reflection phase shifts of blue light on surfaces of the blue light reflective electrode and the cathode. In this embodiment, the value of m may be 1 or 2. Therefore, a microcavity structure of each sub-pixel may have the best cavity length, thereby enhancing light emitted by each sub-pixel.

In an embodiment, the organic light-emitting layer is an organic light-emitting layer of white light. Referring to FIG. 10, a display panel further includes a color filter layer 19 formed on one side of the encapsulation layer 18 facing away from the substrate 11 and disposed corresponding to the red sub-pixel preparation region, the green sub-pixel preparation region and the blue sub-pixel preparation region, so as to implement the colorization of a display image.

In an embodiment, the organic light-emitting layer is a white quantum dot light-emitting layer. The white quantum dot light-emitting layer includes a red quantum dot material, a green quantum dot material and a blue quantum dot material. The white quantum dot light-emitting layer includes a red light-emitting peak, a green light-emitting peak and a blue light-emitting peak. The difference between the red light-emitting peak and the green light-emitting peak is larger than or equal to the sum of a red half-peak width and a green half-peak width. The difference between the green light-emitting peak and the blue light-emitting peak is larger than or equal to the sum of the green half-peak width and a blue half-peak width. Thus, it is not necessary to dispose the color filter layer. Meanwhile, the device brightness can be improved, the power consumption can be reduced, and the manufacturing cost can also be reduced.

In an embodiment, the material of the transparent insulating layer 13 is SiO2, SiNx or photoresist; and the material of the transparent conductive layer 14 is ITO, AZO or IZO.

In an embodiment, the organic electroluminescent device is the display panel.

The embodiments of the organic electroluminescent device described above correspond to the method embodiments described above, belong to the same inventive concept and have the same functions and beneficial effects as the method embodiments described above.

Figure 11:
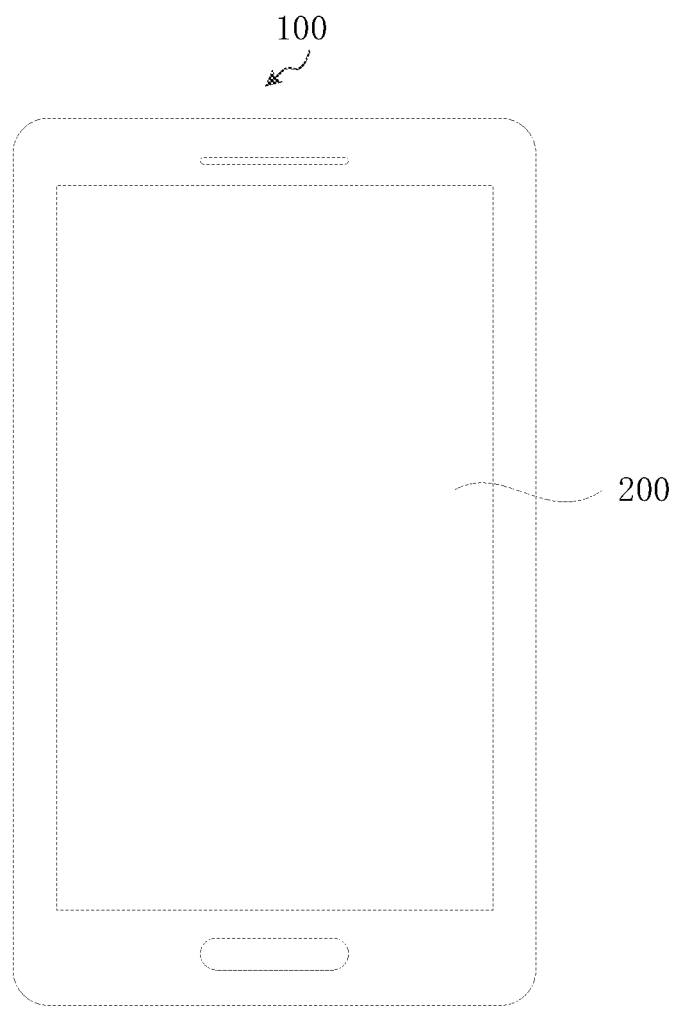
FIG. 11 is a structural diagram of a display apparatus according to an embodiment.

This embodiment further provides a display apparatus, as shown in FIG. 11. The display apparatus 100 includes the organic electroluminescent device 200 of any embodiment described above.

In an embodiment, the organic electroluminescent apparatus 100 may be a mobile phone, a computer, a television, a smart wearable display device or the like, which is not particularly limited in this embodiment.

This embodiment further provides a light-emitting apparatus. The light-emitting apparatus includes the organic electroluminescent device 200 of any embodiment described above.

What is claimed is:

1. A method for preparing an organic electroluminescent device, wherein the organic electroluminescent device comprises a plurality of pixels, each pixel of the plurality of pixels comprises at least a red sub-pixel, a green sub-pixel and a blue sub-pixel, and the method for preparing the organic electroluminescent device comprises:

providing a substrate, wherein the substrate comprises a red sub-pixel preparation region corresponding to the red sub-pixel, a green sub-pixel preparation region corresponding to the green sub-pixel, and a blue sub-pixel preparation region corresponding to the blue sub-pixel;

forming a red light reflective electrode, a green light reflective electrode and a blue light reflective electrode on the substrate, the red light reflective electrode being located in the red sub-pixel preparation region, the green light reflective electrode being located in the green sub-pixel preparation region, and the blue light reflective electrode being located in the blue sub-pixel preparation region;

forming a transparent insulating layer on a surface of a side of the red light reflective electrode facing away from the substrate, wherein an area of the transparent insulating layer is smaller than an area of the red light reflective electrode;

forming a transparent conductive layer on a surface of a side of the transparent insulating layer facing away from the substrate, forming a transparent conductive layer on a surface of a side of the red light reflective electrode facing away from the substrate and not covered by the transparent insulating layer, and forming a transparent conductive layer on a surface of a side of the green light reflective electrode facing away from the substrate;

forming a pixel definition layer between adjacent sub-pixels;

forming an organic light-emitting structure on a surface of a side of the transparent conductive layer facing away from the substrate and a surface of a side of the blue light reflective electrode facing away from the substrate, wherein the organic light-emitting structure comprises at least an organic light-emitting layer;

forming a cathode on a surface of a side of the organic light-emitting structure facing away from the substrate; and forming an encapsulation layer on a side of the cathode facing away from the substrate.

2. The method of claim 1, wherein forming the organic light-emitting structure on the surface of the side of the transparent conductive layer facing away from the substrate and the surface of the side of the blue light reflective electrode facing away from the substrate comprises:

forming the organic light emitting structure by evaporation on the surface of the side of the transparent conductive layer facing away from the substrate and forming the organic light emitting structure by evaporation on the surface of the side of the blue light reflective electrode facing away from the substrate, wherein the surface of the side of the transparent conductive layer and the surface of the side of the blue light reflective electrode are between pixel definition layers.

3. The method of claim 1, wherein forming the cathode on the surface of the side of the organic light-emitting structure facing away from the substrate comprises:

forming a cathode covering the organic light-emitting structure and covering the pixel definition layer.

4. The method of claim 1, wherein the cathode is a transparent electrode or a translucent electrode.

5. The method of claim 1, wherein a thickness $h_1$ of the transparent insulating layer satisfies a following formula:

$$h_1 = \frac{\frac{m\lambda_1}{2} - n_o * d - \frac{\lambda_1 * \theta_1}{4\pi} - n_2 * h_2}{n_1};$$

a thickness $h_2$ of the transparent conductive layer satisfies a following formula:

$$h_2 = \frac{\frac{m\lambda_2}{2} - n_o * d - \frac{\lambda_2 * \theta_2}{4\pi}}{n_2};$$

and a thickness d of the organic light-emitting structure satisfies a following formula:

$$d = \frac{\lambda_3 \left(\frac{m}{2} - \frac{\theta_3}{4\pi}\right)}{n_o},$$

wherein m denotes modulus, $\lambda_1$ denotes a center wavelength of a red light, $\lambda_2$ denotes a center wavelength of a green light, $\lambda_3$ denotes a center wavelength of a blue light, $n_0$ denotes a refractive index of the organic light-emitting structure, $n_1$ denotes a refractive index of the transparent insulating layer, $n_2$ denotes a refractive index of the transparent conductive layer, $\theta_1$ denotes a sum of a reflection phase shift of a red light on a surface of the red light reflective electrode and a reflection phase shift of a red light on a surface of the cathode, $\theta_2$ denotes a sum of reflection phase shifts of green light on surfaces of the green light reflective electrode and the cathode, and $\theta_3$ denotes a sum of reflection phase shifts of blue light on surfaces of the blue light reflective electrode and the cathode.

6. The method of claim 1, wherein a material of the transparent insulating layer is silicon dioxide ($SiO_2$), silicon nitride ($SiN_x$) or photoresist; and a material of the transparent conductive layer is indium tin oxide (ITO), aluminum zinc oxide (AZO) or indium zinc oxide (IZO).

7. An organic electroluminescent device, comprising: a plurality of pixels, wherein each of the plurality of pixels comprises at least a red sub-pixel, a green sub-pixel and a blue sub-pixel, and the plurality of pixels comprise:
a substrate comprising a red sub-pixel preparation region corresponding to the red sub-pixel, a green sub-pixel preparation region corresponding to the green sub-pixel, and a blue sub-pixel preparation region corresponding to the blue sub-pixel;
a reflective electrode layer formed on the substrate and comprises a red light reflective electrode located in the red sub-pixel preparation region, a green light reflective electrode located in the green sub-pixel preparation region, and a blue light reflective electrode located in the blue sub-pixel preparation region;
a transparent insulating layer located on a surface of a side of the red light reflective electrode facing away from the substrate, wherein an area of the transparent insulating layer is smaller than an area of the red light reflective electrode;
a transparent conductive layer located on a surface of a side of the transparent insulating layer facing away from the substrate, a transparent conductive layer located on a surface of a side of the red light reflective electrode facing away from the substrate and not covered by the transparent insulating layer, and a transparent conductive layer located on a surface of a side of the green light reflective electrode facing away from the substrate;
a pixel definition layer formed between adjacent sub-pixels;
an organic light-emitting structure located on a surface of a side of the transparent conductive layer facing away from the substrate, and a surface of a side of the blue light reflective electrode facing away from the substrate, wherein the organic light-emitting structure comprises at least an organic light-emitting layer;
a cathode, which is located on a surface of a side of the organic light-emitting structure facing away from the substrate; and
an encapsulation layer, which is located on one side of the cathode facing away from the substrate.

8. The organic electroluminescent device of claim 7, wherein a thickness $h_1$ of the transparent insulating layer satisfies the following formula:

$$h_1 = \frac{\frac{m\lambda_1}{2} - n_o * d - \frac{\lambda_1 * \theta_1}{4\pi} - n_2 * h_2}{n_1};$$

a thickness $h_2$ of the transparent conductive layer satisfies the following formula:

$$h_2 = \frac{\frac{m\lambda_2}{2} - n_o * d - \frac{\lambda_2 * \theta_2}{4\pi}}{n_2};$$

and a thickness d of the organic light-emitting structure satisfies the following formula:

$$d = \frac{\lambda_3 \left(\frac{m}{2} - \frac{\theta_3}{4\pi}\right)}{n_o},$$

wherein m denotes modulus, $\lambda_1$ denotes a center wavelength of a red light, $\lambda_2$ denotes a center wavelength of a green light, $\lambda_3$ denotes a center wavelength of a blue light, $n_0$ denotes a refractive index of the organic light-emitting structure, $n_1$ denotes a refractive index of the transparent insulating layer, $n_2$ denotes a refractive index of the transparent conductive layer, $\theta_1$ denotes a sum of a reflection phase shift of a red light on a surface of the red light reflective electrode and a reflection phase shift of a red light on a surface of the cathode, $\theta_2$ denotes a sum of reflection phase shifts of green light on surfaces of the green light reflective electrode and the cathode, and $\theta_3$ denotes a sum of reflection phase shifts of blue light on surfaces of the blue light reflective electrode and the cathode.

9. The organic electroluminescent device of claim 7, wherein a material of the transparent insulating layer is silicon dioxide ($SiO_2$), silicon nitride ($SiN_x$) or photoresist; and a material of the transparent conductive layer is indium tin oxide (ITO), aluminum zinc oxide (AZO) or indium zinc oxide (IZO).

10. A display apparatus, comprising an organic electroluminescent device,
wherein the organic electroluminescent device comprises:
a plurality of pixels, wherein each of the plurality of pixels comprises at least a red sub-pixel, a green sub-pixel and a blue sub-pixel, and the plurality of pixels comprise:

a substrate comprising a red sub-pixel preparation region corresponding to the red sub-pixel, a green sub-pixel preparation region corresponding to the green sub-pixel, and a blue sub-pixel preparation region corresponding to the blue sub-pixel;

a reflective electrode layer formed on the substrate and comprises a red light reflective electrode located in the red sub-pixel preparation region, a green light reflective electrode located in the green sub-pixel preparation region, and a blue light reflective electrode located in the blue sub-pixel preparation region;

a transparent insulating layer located on a surface of a side of the red light reflective electrode facing away from the substrate, wherein an area of the transparent insulating layer is smaller than an area of the red light reflective electrode;

a transparent conductive layer located on a surface of a side of the transparent insulating layer facing away from the substrate, a transparent conductive layer located on a surface of a side of the red light reflective electrode facing away from the substrate and not covered by the transparent insulating layer, and a transparent conductive layer located on a surface of a side of the green light reflective electrode facing away from the substrate;

a pixel definition layer formed between adjacent sub-pixels;

an organic light-emitting structure located on a surface of a side of the transparent conductive layer facing away from the substrate, and a surface of a side of the blue light reflective electrode facing away from the substrate, wherein the organic light-emitting structure comprises at least an organic light-emitting layer;

a cathode, which is located on a surface of a side of the organic light-emitting structure facing away from the substrate; and an encapsulation layer, which is located on one side of the cathode facing away from the substrate.

11. The display apparatus of claim 10, wherein a thickness $h_1$ of the transparent insulating layer satisfies the following formula:

$$h_1 = \frac{\frac{m\lambda_1}{2} - n_o * d - \frac{\lambda_1 * \theta_1}{4\pi} - n_2 * h_2}{n_1};$$

a thickness $h_2$ of the transparent conductive layer satisfies the following formula:

$$h_2 = \frac{\frac{m\lambda_2}{2} - n_o * d - \frac{\lambda_2 * \theta_2}{4\pi}}{n_2};$$

and a thickness d of the organic light-emitting structure satisfies the following formula:

$$d = \frac{\lambda_3\left(\frac{m}{2} - \frac{\theta_3}{4\pi}\right)}{n_o},$$

wherein m denotes modulus, $\lambda_1$ denotes a center wavelength of a red light, $\lambda_2$ denotes a center wavelength of a green light, $\lambda_3$ denotes a center wavelength of a blue light, $n_0$ denotes a refractive index of the organic light-emitting structure, $n_1$ denotes a refractive index of the transparent insulating layer, $n_2$ denotes a refractive index of the transparent conductive layer, $\theta_1$ denotes a sum of a reflection phase shift of a red light on a surface of the red light reflective electrode and a reflection phase shift of a red light on a surface of the cathode, $\theta_2$ denotes a sum of reflection phase shifts of green light on surfaces of the green light reflective electrode and the cathode, and $\theta_3$ denotes a sum of reflection phase shifts of blue light on surfaces of the blue light reflective electrode and the cathode.

12. The display apparatus of claim 10, wherein a material of the transparent insulating layer is silicon dioxide ($SiO_2$), silicon nitride ($SiN_x$) or photoresist; and a material of the transparent conductive layer is indium tin oxide (ITO), aluminum zinc oxide (AZO) or indium zinc oxide (IZO).

* * * * *